United States Patent [19]

Kisner

[11] Patent Number: 4,517,070
[45] Date of Patent: May 14, 1985

[54] MAGNETRON SPUTTERING CATHODE ASSEMBLY AND MAGNET ASSEMBLY THEREFOR

[75] Inventor: Howard D. Kisner, Wichita Falls, Tex.

[73] Assignee: General Motors Corporation, Detroit, Mich.

[21] Appl. No.: 625,847

[22] Filed: Jun. 28, 1984

[51] Int. Cl.³ .............................................. C23C 15/00
[52] U.S. Cl. .................................... 204/298; 204/192 R
[58] Field of Search ............................ 204/298, 192 R

[56] References Cited

U.S. PATENT DOCUMENTS

| | | |
|---|---|---|
| 3,528,902 | 9/1970 | Wasa et al. .......................... 204/298 |
| 3,878,085 | 4/1975 | Corbani ............................... 204/298 |
| 4,046,660 | 9/1977 | Fraser ................................. 204/298 |
| 4,198,283 | 4/1980 | Class et al. .......................... 204/298 |
| 4,204,936 | 5/1980 | Hartsough ........................... 204/298 |
| 4,282,083 | 8/1981 | Kertesz ............................... 204/298 |
| 4,370,217 | 1/1983 | Funaki ................................ 204/298 |

OTHER PUBLICATIONS

Hieronymi et al. Thin Solid Films 96(1982), pp. 241-247.
Chapin Vacuum Technol. Jan. 1974 pp. 38-40.
Van Vorous; Solid State Technol, Dec. 1976 pp. 62-66.
Nyaiesh; Thin Solid Films 86(1981) pp. 267-277.

*Primary Examiner*—Arthur P. Demers
*Attorney, Agent, or Firm*—Warren D. Hill

[57] ABSTRACT

A planar magnetron sputtering cathode assembly especially for simultaneously heating and coating substrates is also adaptable to a cool substrate operation. The cathode assembly features an efficient magnetic circuit using magnet assemblies enclosed within the sputtering chamber using minimal air gaps for magnetic efficiency and high-strength magnets to produce a high field at the sputtering target, and stainless steel cladding of the magnets to protect the magnets as well as to prevent out-gasing from the magnet material. A heat sink fills the space between the magnets to provide excellent cooling of the magnets as well as cooling of the target which seats directly on the heat sink. The target is held in place by bolts to facilitate rapid target changing.

5 Claims, 4 Drawing Figures

MAGNETRON SPUTTERING CATHODE ASSEMBLY AND MAGNET ASSEMBLY THEREFOR

This invention relates to a planar magnetron sputtering cathode assembly and to a magnet assembly for incorporation in such a cathode assembly. The use of planar magnetron sputtering devices for depositing films of metals and other materials onto substrates has become widespread and has gained diverse applications. One of the chief advantages of this coating technique is its versatility. It is much in demand for its ability to sputter materials onto substrates without subjecting them to high temperatures. On the other hand, the technique is adaptable to processes where a high substrate temperature is required. An electron flux emitted by the cathode can flow to the substrate causing it to be heated to several hundred degrees Celsius. It is well known, however, to equip the cathode with electron capture shields to eliminate the electron heating where cool substrate operation is desired. An example of the hot substrate method is set forth in my U.S. Pat. No. 4,400,255. According to my patented method, exhaust gas oxygen sensors are produced by sputtering a platinum film onto a vitrified zirconia thimble, the thimble being heated to a high temperature during the sputtering operation by electron flow from the sputtering cathode. As pointed out in that patent, a Model MRC 902 DC magnetron sputtering apparatus obtained from the Materials Research Corporation of Orangeburg, N.Y., has been used for the sputtering operation. In an attempt to improve target usage efficiency, a newer sputtering cathode obtained from the same manufacturer and described in U.S. Pat. No. 4,198,283 Class et al, was installed in the MRC apparatus and tried in the manufacture of exhaust gas oxygen sensors. The patented cathode was originally equipped with inner and outer electron capture shields for cool substrate operation. Even though the shields were removed to enhance the heating of the zirconia thimbles, insufficient thimble heating occurred even while using the same electrical power input as used in regular production, and the resulting product quality was unacceptable.

By designing a new cathode structure and new magnet assemblies which are the subject of this invention, I was able to produce exhaust gas oxygen sensors of unsurpassed quality and at a higher sputtering rate than ever before and, in addition, was able to reduce down time of the sputtering apparatus. This design emphasizes a higher magnetic flux density than is customarily used for magnetron sputtering and an arrangement to facilitate rapid changing of targets. The magnetic field strength is enhanced by the use of strong magnets and a magnetic circuit which is contained wholly within the sputtering chamber, in contrast to those magnetron designs which position the magnets outside the chamber and couple the magnetic field into the chamber through a copper heat sink. A refined magnet assembly design is compatible with the vacuum conditions and heat conditions of a magnetron sputtering chamber.

It is therefore a general object of the invention to provide a magnetron sputtering cathode assembly having an efficient magnetic circuit for enhancing the magnetic flux density.

Another object of the invention is to provide a magnetron sputtering cathode assembly with a target-mounting arrangement facilitating rapid target changing.

A further object of the invention is to provide a magnet assembly especially adapted for a magnetron sputtering cathode assembly and compatible with the environment of a sputtering chamber.

The invention is carried out by providing a high-strength magnet hermetically sealed within a two-part steel housing, one part comprising a ferromagnetic material contacting a magnet pole and serving as a pole-piece, and the other part comprising a nonmagnetic material surrounding the other pole and the sides of the magnet to complete the housing. The invention is further carried out by providing a magnetron sputtering cathode assembly incorporating two such magnet assemblies directly attached to a magnetic steel backing plate to define a space substantially filled by a water-cooled heat sink, and a target directly mounted on the heat sink. The invention is further carried out by providing in the magnetron sputtering cathode assembly an arrangement for rapidly changing the targets including threaded fasteners extending through the backing plate and heat sink and threaded into the target.

The above and other advantages will become more apparent from the following description taken in conjunction with the accompanying drawings, wherein.

Figure 1:
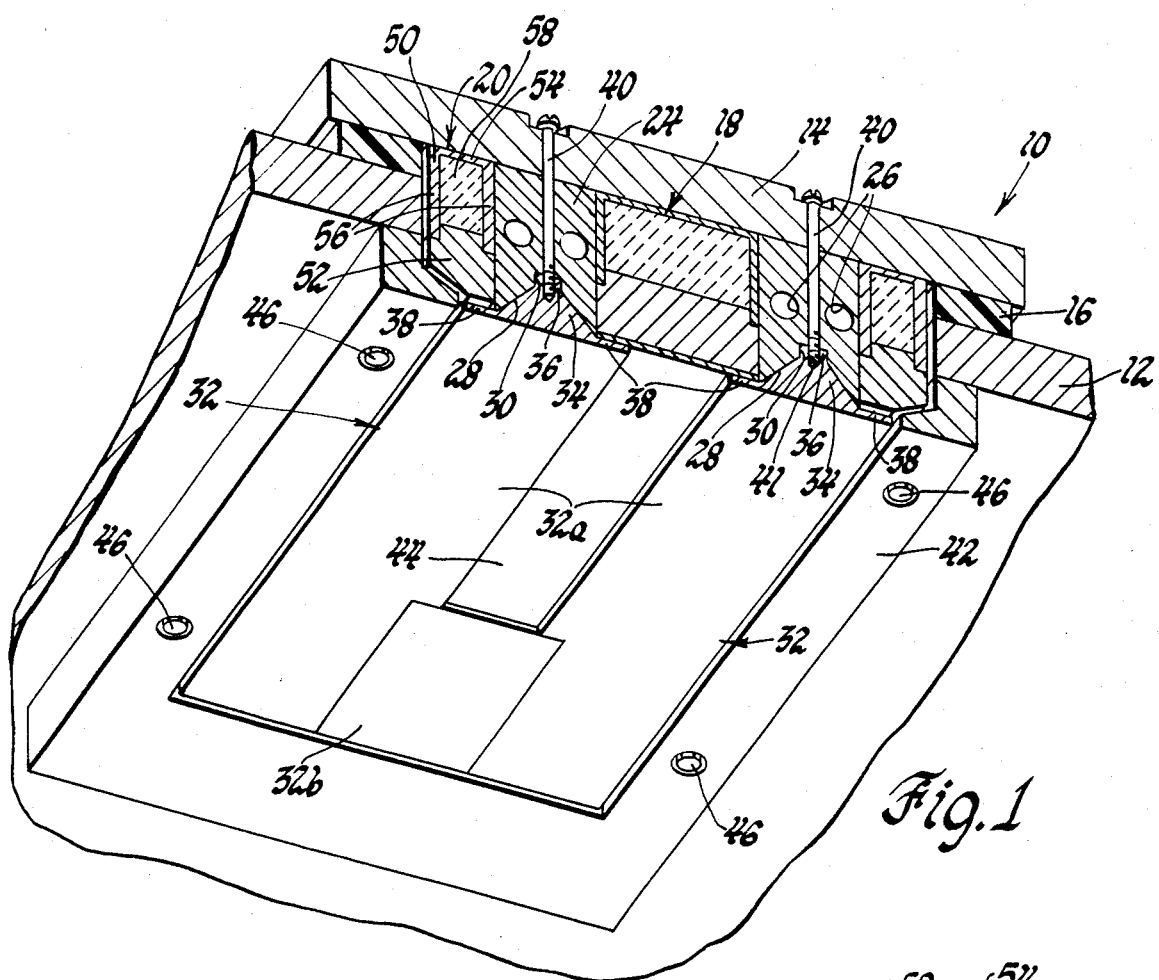
FIG. 1 is a cross-sectional isometric view of a planar magnetron sputtering cathode assembly according to the invention.
Figure 2:
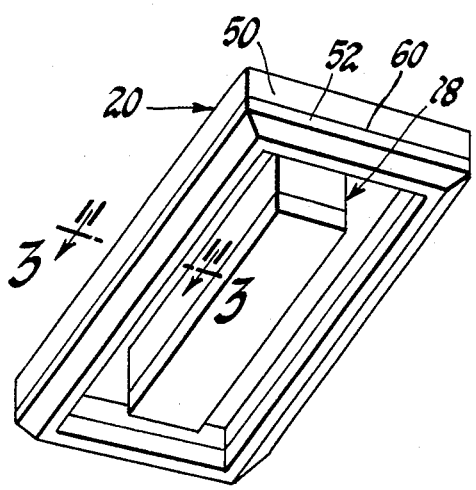
FIG. 2 is an isometric view of the two magnet assemblies of the cathode assembly of FIG. 1.

Referring to FIG. 1, a planar magnetron sputtering cathode assembly 10 is mounted in an opening of the top wall 12 of a sputtering chamber so that at least a portion of the cathode assembly 10 extends down into the chamber. The upper element of the cathode assembly 10 is a rectangular magnetic stainless steel backing plate 14 which covers the opening in the wall 12 and is spaced therefrom by an electrically insulating vacuum seal 16 surrounding the opening. The backing plate 14 preferably comprises Carpenter No. 630 condition A stainless steel, described more fully below. As best shown in FIG. 2, an inner magnet assembly 18 in the shape of a bar and an outer magnet assembly 20 in the shape of a rectangular annulus or picture frame are mounted directly to the bottom of the backing plate 14 and are held in place by magnetic force. The outer magnet assembly 20 surrounds the inner magnet assembly 18 to define a rectangular space therebetween. A rectangular annular copper heat sink 24 is positioned in the space between the two magnet assemblies to make intimate thermal contact with the mutually facing side surfaces of the magnet assemblies. To ensure good thermal coupling between the heat sink and the magnet assemblies, these three elements are pressfitted together with an indium foil shim (not shown) between the heat sink 24 and the magnet assemblies 18 and 20. Passages 26 for circulating cooling water are provided throughout the heat sink 24. Inlet and outlet water pipes (not shown) extend from the top of the heat sink and through suitable apertures in the backing plate 14. The lower surface of the heat sink which is spaced from and facing away from the backing plate 14, contains a shallow tapered depression 28 that terminates at its apex in a generally rectangular cross-section groove 30 in the heat sink. The depression 28 extends around the lower surface of the heat sink 24 to form an annular trough.

A rectangular annular target 32 has a planar lower surface, and its upper surface has an upwardly tapered protrusion 34 mating with the tapered depression 28 in the heat sink 24 so that the target 32 enjoys good thermal coupling to the heat sink. The protrusion 34 terminates at its apex in a generally rectangular cross-section rib 36 which seats in the groove 30 of the heat sink. Each side margin of the target 32 extends in the form of a thin flange 38 partially covering the lower pole faces of the inner and outer magnet assemblies 18 and 20. The target 32 is held in place by a plurality of bolts 40 or other threaded fasteners extending through suitable apertures in the backing plate 14 and the heat sink 24. The bolts 40 thread into small bores 41 in the rib 36 of the target. The target, of course, is formed of the material which is to be sputtered onto the substrate, and for coating exhaust gas oxygen sensors, the targets are made of a very pure grade of platinum. The annular rectangular target may be made in a single piece or, as illustrated in FIG. 1, may be segmented. Specifically, a pair of long side-segments 32a extend in the elongated direction of the magnet assemblies, and are bridged at their ends by the target end-segments 32b. The end-segments 32b have the same cross section as that shown and described for the target side-segments 32a. The flanges 38 near the ends of the target side-segments are notched to accommodate each end-segment 32b. I prefer approximate outer target dimensions of 15×5 inches and a target segment width of 2 inches, so that an elongated 1-inch wide space separates the side-segments. To avoid sputtering of the lower pole surface of the inner magnet assembly 18 where it is exposed between the target side-segments 32a, a thin foil 44 of platinum or other target material is bonded to the lower pole surface.

Figure 4:
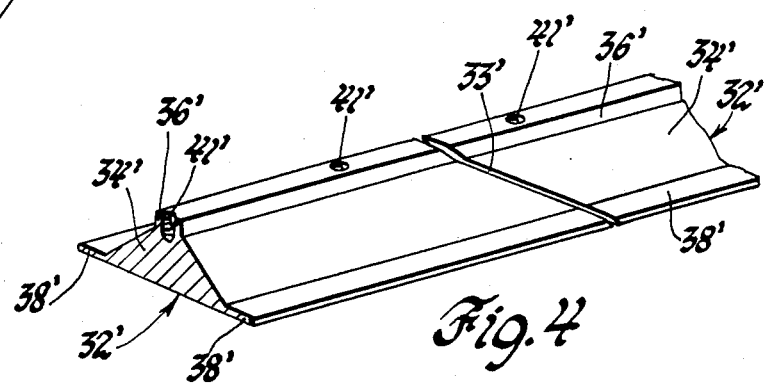
FIG. 4 is a partly broken-away isometric view of an alternate target for the cathode assembly of FIG. 1.

Alternatively, each target long side-segment 32a may be divided into two or more smaller side-segments 32', as shown in FIG. 4. The target segments 32' have the same cross-sections as the target segments 32a of FIG. 1 and thus each has a protrusion 34', a rib 36', flanges 38', and threaded bores 41'. The short side-segments 32' mate along a slanted plane as if a long side-segment were cut at an angle of, say, 60° to the lower target surface, and a small gap 33' of about 0.02 inch is allowed for thermal expansion. The shorter side-segments 32' can be effectively seated in good thermal contact with the heat sink to ensure relatively cool target operation. The long side-segments 32a can also be properly seated on the heat sink, but very precise machining is required and such machining is expensive—especially in the case of a hard material like platinum. The precision machining requirements are greatly relaxed with the shorter segment designs.

A rectangular annular dark space shield 42 is secured to the top wall 12 by bolts 46 and extends around the cathode assembly 10 in close conformance with the outer magnet assembly 20 and spaced therefrom by a small gap (less than 0.1 inch), and terminates a short space from the outer periphery of the target 32. The dark space shield 42 lower surface is in the same plane as the lower surface of the target 32, or may be in a slightly higher plane. In any event, the dark space shield 42 forms a small gap, say, 0.04 inch, with the target edge and prevents sputtering from the lower face of the outer magnet assembly 20.

Figure 3:
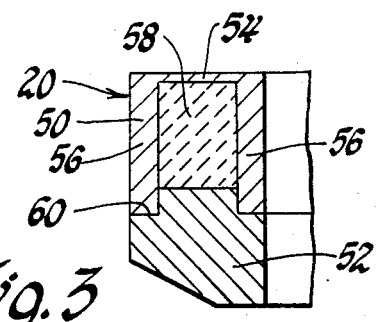
FIG. 3 is a cross-sectional view of one of the magnet assemblies taken along the line 3—3 of FIG. 2.

The magnet assembly design according to the invention allows the magnets to be used within the sputtering chamber environment and, by affording proper protection for the magnet, allows the use of high-strength magnet materials, such as ceramic or rare-earth cobalt magnet materials. Such highstrength magnet materials tend to be brittle and susceptible to thermal and mechanical shock. In addition, such magnet materials tend to be porous so that during the pumping-down operation of a sputtering chamber, out-gasing of the magnet itself can produce troublesome delays at the beginning of a sputtering operation. The magnet assembly design uses steel cladding, preferably stainless steel, for the magnets which are hermetically sealed to isolate the magnets and any entrapped gases from the sputtering chamber environment. More particularly, a polepiece 52 of ferromagnetic stainless steel is situated in contact with one pole of the magnet while a cap 50 of non-magnetic stainless steel which covers the other pole of the magnet and wraps around the sides of the magnet to meet the polepiece. A cross-section of one arm of the outer magnet assembly 20 is shown in FIG. 3. The cap 50 and the polepiece 52 are each formed as a rectangular annulus so that together they result in the annular configuration shown in FIG. 2. The cap 50, of nonmagnetic stainless steel such as AISI type 304, is channel-shaped in section, i.e., it has a very thin endpiece 54 and two legs 56 extending laterally therefrom and spaced apart to define a recess therebetween. A high-strength magnet 58 is seated in the recess and preferably comprises a samarium-cobalt magnet. The magnet 58 need not be in one piece and preferably it is made in four bar-like sections—long ones extending along the sides of the assembly and short ones for the ends of the assembly. The magnet 58 is polarized vertically, as shown in the drawings, so that one pole contacts the cap endpiece 54 and the other pole is directed toward the open end of the cap 50.

The polepiece 52 is made of magnetic stainless steel, such as Carpenter No. 630 condition A stainless steel manufactured by Carpenter Technology Corporation of Reading, Pa. Such steel has been annealed to a magnetically soft condition and also exhibits good weldability compatible with AISI type 304 stainless steel. The polepiece 52 is conformed to abut against the legs 56 of the cap 50 at an interface 60 and to enter within the recess of the cap to make contact with the pole of the magnet 58. The thick polepiece separates the magnet 58 from the region of the hot target 32 and the polepiece is efficiently cooled by the heat sink 24 to protect the magnet 58 from high temperatures or rapid temperature changes. The cap 50 and polepiece 52 are bonded at their interface in a vacuum-tight bond to hermetically seal the magnet 58 within the steel casing. The bonding is preferably carried out by laser welding along the interface 60 since that welding process produces an excellent joint with a minimum of thermal disturbance to the magnet material. The endpiece 54 is as thin as possible consistent with the structural integrity in order to minimize the effect of air gaps in the magnetic flux path. A thickness of 0.03 inch is a practical value for that dimension. The cross-section of the magnet 58 itself may be, for example, 0.5 inch wide and 0.7 inch high. The polepiece 52 extends vertically downwardly to the plane of the lower outer edge of the heat sink 24, and is chamfered along its outer edge to concentrate the magnetic flux toward the direction of the target 32.

The construction principles of the outer magnet assembly 20 are applied to the inner magnet assembly 18. Although the inner magnet assembly 18 configuration is obviously different from that of the outer magnet assembly 20, it employs substantially the same amount of magnet material as the outer magnet assembly. Thus it will be seen that the magnetic circuit is as efficient as can be provided consistent with the required air gap in the vicinity of the target. By virtue of the efficiency of the magnetic circuit and the use of strong magnets, magnetic flux densities at the target surface are obtained which are exceptionally high for planar magnetron sputtering applications. Such high fields lead to the advantages of higher deposition rates and higher electron flux for the same electrical power. As a specific example, for an outer magnet assembly containing a samarium-cobalt magnet having a cross section area of 0.5 × 0.7 inch, and an equivalent mass of the same magnet material in the inner magnet assembly, a magnet assembly height of about 1.5 inch and an air gap in the target region on the order of 1.25 inch, a magnetic flux density of 750 gauss is obtained at the center of and parallel to the target face, and a flux density of 3000 gauss is obtained perpendicular to and adjacent each lower pole face.

Studies made of commercially available planar magnetron sputtering cathodes of the rectangular target variety utilizing a rectangular annular outer magnet arrangement reveal that two streams of unusually high electron flux occur at opposite corners of the cathode assembly, and since the electron flux impinging on a substrate beneath the cathode assembly causes heating of the substrate, hot spots in the substrate are created by the nonuniform electron flow. It is well understood by those skilled in the art that the effective action of the magnetron sputtering apparatus is in large part due to trapping an electron field within an endless loop created by the magnetic field. A portion of the electrons do escape from the field primarily at the magnetic poles and the resulting electron flow is the chief substrate heating agent. It is believed that the high electron emission at corners of the target is due to a weakness or a discontinuity in the magnetic field at those corners. The present magnet assembly design, according to the invention, produces a substantially uniform, or at least continuous, field at the corners of the magnet assembly so that the nonuniformity of electron emission is substantially eliminated. This is accomplished by forming the polepiece 52 of the outer magnet assembly 20 of a single piece of steel so that even at the corners of the assembly 20, there are no gaps or welds which would otherwise result in nonhomogeneous magnetic properties.

It will thus be seen that the magnetron cathode structure according to the invention results in advantages in two areas: sputtering operation and improved machine down time between operations. In the sputtering operation for processing the exhaust gas oxygen sensors where substrate heating as well as coating is required, the stronger and more uniform magnetic field allows the selection of operating parameters which result in faster and more uniform heating, and a higher film deposition rate—all of which lead to improved yields of high quality parts as well as higher sputtering rates. When it is necessary to open the sputtering chamber for changing targets and other maintenance, the machine down time is minimized by the ease of changing the targets, which is readily accomplished in twenty or thirty minutes, and by a more rapid pumping-down operation to draw a vacuum in the sputtering chamber. The latter is enhanced by the use of materials, particularly the stainless steel cladding of the magnets which produces a minimum of out-gasing, and is therefore quite compatible with high-vacuum technology. In contrast, the use of soft iron polepieces, for example, would lengthen the pumping-down time because of out-gasing of the iron.

While the cathode arrangement of this invention is especially designed for applying a film of material onto hot substrates, it is expected that many of the enumerated advantages could be retained in a cold substrate application. The heating of the substrate can be minimized by adding electron capture shields in the vicinity of the magnetic poles. It is recognized that the addition of such shields can result in longer target change times; however, the advantages of the stronger magnetic field can still lead to faster deposition rates and higher productivity, as well as other advantages which flow from the ability to adjust operating parameters to values which were inappropriate in the case of the older commercial designs employing relatively weak magnetic fields.

The embodiments of the invention for which an exclusive property or privilege is claimed are defined as follows:

1. A planar magnetron sputtering cathode assembly comprising:

a backing plate of magnetic material;

a bar-shaped inner magnet assembly and an elongated annular outer magnet assembly surrounding the inner magnet assembly, the assemblies having mutually facing surfaces bounding a space between the assemblies, each assembly having a first pole directly attached to the backing plate for support thereby and for efficient magnetic coupling and a second pole spaced from the backing plate to establish a magnetic field between the two said second poles;

each magnet assembly including magnet means having two poles, a magnetic steel polepiece engaging one of the magnet poles, a nonmagnetic steel channel snugly surrounding the other of the magnet poles and the sides of the magnet means and engaging the polepiece, and a weldment for hermetically sealing the channel to the polepiece, whereby the magnet means is completely encased in steel and isolated from the sputtering cathode environment;

a water-cooled heat sink in the space between the inner and outer magnet assemblies in intimate thermal contact with the said surfaces bounding the space to cool the magnet assemblies, the heat sink having a face directed away from and spaced from the backing plate; and an elongated annular target thermally coupled to the said heat sink face in the magnetic field.

2. A planar magnetron sputtering cathode assembly comprising:

a backing plate of magnetic material;

a bar-shaped inner magnet assembly and an elongated annular outer magnet assembly surrounding the inner magnet assembly, the assemblies having mutually facing surfaces bounding a space between the assemblies, each assembly having a first pole directly attached to the backing plate for support thereby and for efficient magnetic coupling and a second pole spaced from the backing plate to establish a magnetic field between the two said second poles;

each magnet assembly including magnet means having two poles, a magnetic steel polepiece engaging one of the magnet poles, a nonmagnetic steel channel snugly surrounding the other of the magnet poles and the sides of the magnet means and engaging the polepiece, and a weldment for hermetically sealing the channel to the polepiece, whereby the magnet means is completely encased in steel and isolated from the sputtering cathode environment;

a water-cooled heat sink in the space between the inner and outer magnet assemblies in intimate thermal contact with the said surfaces bounding the space to cool the magnet assemblies, the heat sink having a face directed away from and spaced from the backing plate and containing an annular depression;

an elongated annular target having an annular protrusion intimately thermally coupled to the depression in said heat sink face in the magnetic field; and means for securing the target to the heat sink to facilitate rapid target changing comprising threaded fastener means extending through the backing plate and the heat sink and threaded into the target protrusion.

3. A planar magnetron sputtering cathode assembly comprising:

a backing plate of magnetic material;

a bar-shaped inner magnet assembly and a rectangular annular outer magnet assembly surrounding the inner magnet assembly, the assemblies having mutually facing surfaces bounding a space between the assemblies, each assembly having a first pole directly attached to the backing plate for support thereby and for efficient magnetic coupling and a second pole spaced from the backing plate to establish a magnetic field between the two said second poles;

a water-cooled heat sink in the space between the inner and outer magnet assemblies in intimate thermal contact with the said surfaces bounding the space to cool the magnet assemblies, the heat sink having a surface spaced from the backing plate containing an annular trough directed away from the backing plate;

a rectangular annular target thermally coupled to the said heat sink surface in the magnetic field, the target having a tapered protrusion seated in the trough in intimate thermal contact with the heat sink; and means for securing the target to the heat sink to facilitate rapid target changing comprising a plurality of bolts extending through the backing plate and the heat sink and threaded into the tapered protrusion.

4. A magnet assembly for a magnetron sputtering cathode comprising:

a magnetic stainless steel polepiece;

a nonmagnetic stainless steel cap having an endpiece with laterally extending legs defining a channel-shaped cross section, the legs being hermetically joined to the polepiece to define a sealed cavity; and a magnet within the cavity with the poles of the magnet adjacent the endpiece and the polepiece, respectively, whereby the magnet is completely encased in stainless steel and is hermetically isolated from the environment of the sputtering cathode.

5. A magnet assembly for a magnetron sputtering cathode comprising:

a unitary polepiece of magnetic material having a rectangular annular shape;

a nonmagnetic cap having the same rectangular annular configuration as the polepiece hermetically joined to the polepiece, an annular cavity in and extending around the cap, one side of the cavity being bounded by the polepiece; and a multipiece rectangular annular magnet in the cavity and having one pole engaging the polepiece, whereby the magnet is completely encased and hermetically sealed and, due to the unitary polepiece, a continuous magnetic field emanates from the assembly.

* * * * *